(12) United States Patent
Saxena et al.

(10) Patent No.: US 10,141,900 B2
(45) Date of Patent: Nov. 27, 2018

(54) OFFSET TRIMMING FOR DIFFERENTIAL AMPLIFIER

(71) Applicant: SanDisk Technologies, Inc., Plano, TX (US)

(72) Inventors: Deep Saxena, Bengaluru (IN); Saurabh Singh, Edinburgh (GB)

(73) Assignee: SANDISK TECHNOLOGIES LLC, Plano, TX (US)

(*) Notice: Subject to any disclaimer, the term of this patent is extended or adjusted under 35 U.S.C. 154(b) by 11 days.

(21) Appl. No.: 15/497,232

(22) Filed: Apr. 26, 2017

(65) Prior Publication Data

US 2018/0316324 A1    Nov. 1, 2018

(51) Int. Cl.
*H03F 3/45* (2006.01)
*H03F 3/347* (2006.01)

(52) U.S. Cl.
CPC ......... *H03F 3/45179* (2013.01); *H03F 3/347* (2013.01); *H03F 3/45112* (2013.01); *H03F 3/45376* (2013.01); *H03F 3/45596* (2013.01); *H03F 3/45085* (2013.01); *H03F 3/45183* (2013.01)

(58) Field of Classification Search
CPC .. H03F 3/45179; H03F 3/347; H03F 3/45112; H03F 3/45376; H03F 3/45596; H03F 1/34; H03F 3/45; H03F 3/45071; H03F 3/45183
See application file for complete search history.

(56) References Cited

U.S. PATENT DOCUMENTS

| 4,464,631 | A  |   | 8/1984  | Prentice      |              |
|-----------|----|---|---------|---------------|--------------|
| 4,928,056 | A  |   | 5/1990  | Pease         |              |
| 5,325,045 | A  | * | 6/1994  | Sundby ...... | G05F 3/30    |
|           |    |   |         |               | 323/313      |
| 6,194,962 | B1 |   | 2/2001  | Chen          |              |
| 6,424,211 | B1 |   | 7/2002  | Nolan et al.  |              |
| 6,803,803 | B1 | * | 10/2004 | Starr ......  | H03K 19/00384|
|           |    |   |         |               | 327/378      |
| 7,012,466 | B2 | * | 3/2006  | Cerisola .... | G05F 1/561   |
|           |    |   |         |               | 330/102      |
| 7,286,003 | B2 | * | 10/2007 | Chatterjee .. | G05F 3/242   |
|           |    |   |         |               | 327/513      |
| 7,457,178 | B2 |   | 11/2008 | Tu et al.     |              |

(Continued)

OTHER PUBLICATIONS

Hank Zumbahlen, Basic Linear Design, Introduction, Analog Devices, 2007.

(Continued)

*Primary Examiner* — Khanh V Nguyen
(74) *Attorney, Agent, or Firm* — Kunzler, PC

(57) ABSTRACT

Apparatuses, systems, and methods are disclosed for offset trimming for differential amplifiers. An apparatus includes a differential amplifier. A differential amplifier includes a non-inverting input, an inverting input, and an output coupled to the inverting input via a voltage divider. A first variable current source is coupled to a non-inverting input, so that increasing a current from the first variable current source increases a voltage at the non-inverting input. A second variable current source is coupled to an inverting input, and to an output via a voltage divider, so that increasing a current from the second variable current source decreases a voltage at the output.

20 Claims, 6 Drawing Sheets

(56) References Cited

U.S. PATENT DOCUMENTS

| | | |
|---|---|---|
| 7,956,679 B2 | 6/2011 | Kimura |
| 7,974,134 B2 | 7/2011 | Zhang et al. |
| 8,559,250 B2 | 10/2013 | Ikeda et al. |
| 8,786,358 B2 * | 7/2014 | Endo .................. G05F 3/245 |
| | | 327/513 |
| 9,318,210 B1 | 4/2016 | Hart et al. |
| 9,378,834 B2 | 6/2016 | Qian et al. |
| 2016/0179113 A1 | 6/2016 | Taigor et al. |

OTHER PUBLICATIONS

Hank Zumbahlen, Basic Linear Design, Chapter 1, Analog Devices, 2007.
Hank Zumbahlen, Basic Linear Design, MT-037, Analog Devices, 2007.

* cited by examiner

OFFSET TRIMMING FOR DIFFERENTIAL AMPLIFIER

TECHNICAL FIELD

The present disclosure, in various embodiments, relates to differential amplifiers and more particularly relates to offset trimming for differential amplifiers.

BACKGROUND

Differential amplifiers, such as operational amplifiers, may be used for a variety of purposes. For example, certain types of non-volatile memory media may use differential amplifiers to produce word line voltages for reading or programming memory cells. In general, a differential amplifier may amplify a voltage difference between two inputs. However, an output from an amplifier may be offset from an expected or desired voltage for various reasons. For example, internal variations among amplifier components may result in an asymmetry between the two inputs, so that the output voltage is zero when a small but nonzero voltage difference exists at the inputs, rather than when the same voltage is applied to both inputs. Similarly, external or system offsets may cause an input voltage to be higher or lower than expected, causing a corresponding offset at an amplifier output.

SUMMARY

Apparatuses are presented for offset trimming for differential amplifiers. In one embodiment, an apparatus includes a differential amplifier. In a further embodiment, a differential amplifier includes a non-inverting input, an inverting input, and an output coupled to the inverting input via a voltage divider. In certain embodiments, a first variable current source is coupled to a non-inverting input. In further embodiments, increasing a current from a first variable current source increases a voltage at a non-inverting input. In various embodiments, a second variable current source is coupled to an inverting input, and to an output via a voltage divider. In further embodiments, increasing a current from a second variable current source decreases a voltage at an output.

Systems are presented for offset trimming for differential amplifiers. In one embodiment, a system includes one or more memory die. In a further embodiment, a memory die includes an array of non-volatile memory cells coupled to a plurality of word lines. In a certain embodiment, a memory die includes a plurality of differential amplifiers coupled to word lines to produce word line voltages. In a further embodiment, differential amplifiers include non-inverting inputs, inverting inputs, and outputs coupled to the inverting inputs via voltage dividers. In some embodiments, a plurality of first variable current sources are coupled to non-inverting inputs of differential amplifiers. In further embodiments, increasing a current from one of a plurality of first variable current sources increases a voltage at a corresponding non-inverting input. In various embodiments, a plurality of second variable current sources are coupled to inverting inputs of differential amplifiers, and to outputs via voltage dividers. In further embodiments, increasing a current from one of a plurality of second variable current sources decreases a voltage at a corresponding output.

An apparatus, in another embodiment, includes means for amplification of an input voltage to drive a word line voltage for a non-volatile memory array. In a certain embodiment, an apparatus includes means for providing a first current. In a further embodiment, a means for providing a first current may be coupled to a non-inverting input of a means for amplification, and coupled to ground via a load resistance, so that increasing the first current increases a word line voltage. In various embodiments, an apparatus includes means for providing a second current. In further embodiments, a means for providing a second current may be coupled to an inverting input of a means for amplification, coupled to an output of the means for amplification via a top resistor of a voltage divider, and coupled to ground via a bottom resistor of the voltage divider, so that increasing the second current decreases a word line voltage.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
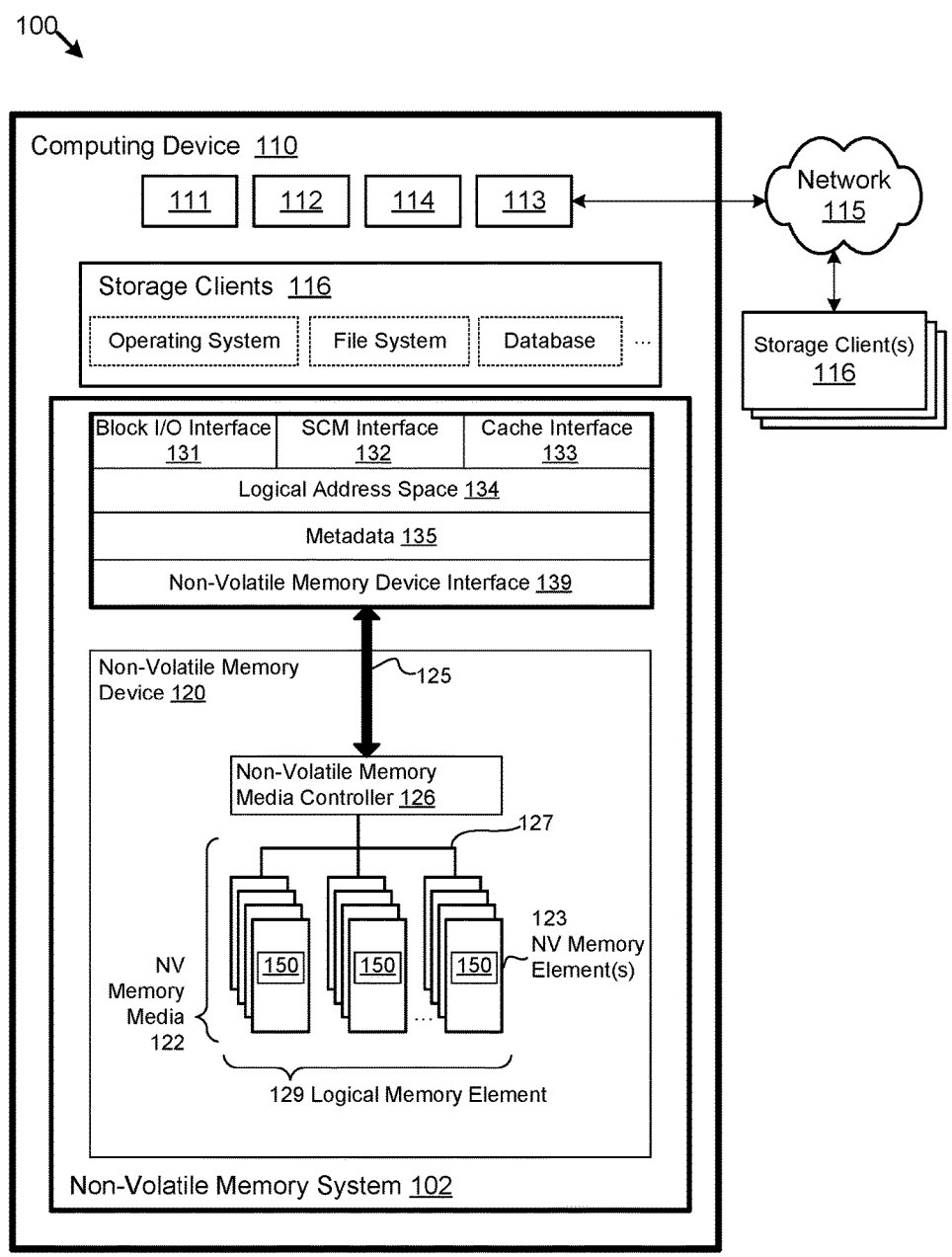
FIG. 1 is a schematic block diagram of one embodiment of a system comprising word line drivers.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of preceding figures. Like numbers may refer to like elements in the figures, including alternate embodiments of like elements.

FIG. 1 is a block diagram of one embodiment of a system 100 comprising word line drivers 150 for a non-volatile memory device 120. The word line drivers 150 may be part of one or more non-volatile memory elements 123 or memory die, and may be in communication with one or more of a non-volatile memory media controller 126, a non-volatile memory element 123, a device driver, or the like. The word line drivers 150 may operate as part of a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 124 to a communication network 115, such as an Internet Protocol network, a Storage Area Network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein.

The non-volatile memory system 102, in the depicted embodiment, includes one or more word line drivers 150. A word line driver 150, in one embodiment, is configured to apply a voltage to a word line of a non-volatile memory array. In certain embodiments, a word line driver 150 may include a differential amplifier that produces a word line voltage, a first variable current source capable of increasing an input voltage of the differential amplifier for trimming a negative voltage offset, and a second variable current source capable of decreasing an output voltage of the differential amplifier for trimming a positive voltage offset.

In general, in various embodiments, an amplifier offset may refer to a difference between an expected and an actual output voltage. In various embodiments, trimming an offset may refer to various types of adjustments to reduce or correct an output offset. Certain methods of amplifier offset trimming may rely on voltages well above ground voltage (0 V) at both inputs, and may be less effective with inputs near zero volts. Dynamic offset cancellation, such as in auto-zero or chopper-stabilized amplifiers, may introduce delays and residual or clock noise. Additionally, adding a clock for dynamic cancellation may increase design complexity and/or silicon area for an amplifier. By contrast, in certain embodiments, using two variable current sources for offset trimming may allow correction of positive and negative offsets, even when input voltages are near zero, while avoiding the added time, noise, or complexity associated with dynamic offset cancellation. The word line drivers 150 are described in greater detail below with regard to FIGS. 2-8.

In one embodiment, the word line drivers 150 may be controlled by logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the word line drivers 150 may be controlled by executable software code, such as a device driver or the like, stored on the computer readable storage medium 114 for execution on the processor 111. In a further embodiment, the word line drivers 150 may be controlled by a combination of both executable software code and logic hardware.

In one embodiment, the non-volatile memory device 120 is configured to receive requests from a device driver or other executable application via a bus 125 or the like. The non-volatile memory device 120 may be further configured to communicate with a device driver or other application via the bus 125. Accordingly, the non-volatile memory device 120, in some embodiments, may comprise and/or be in communication with one or more direct memory access (DMA) modules, remote DMA modules, bus controllers, bridges, buffers, and so on to facilitate communication of data. In another embodiment, the non-volatile memory device 120 may receive requests as an API call from a storage client 116, as an IO-CTL command, or the like.

According to various embodiments, a non-volatile memory controller 126 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, expansion cards, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 2:
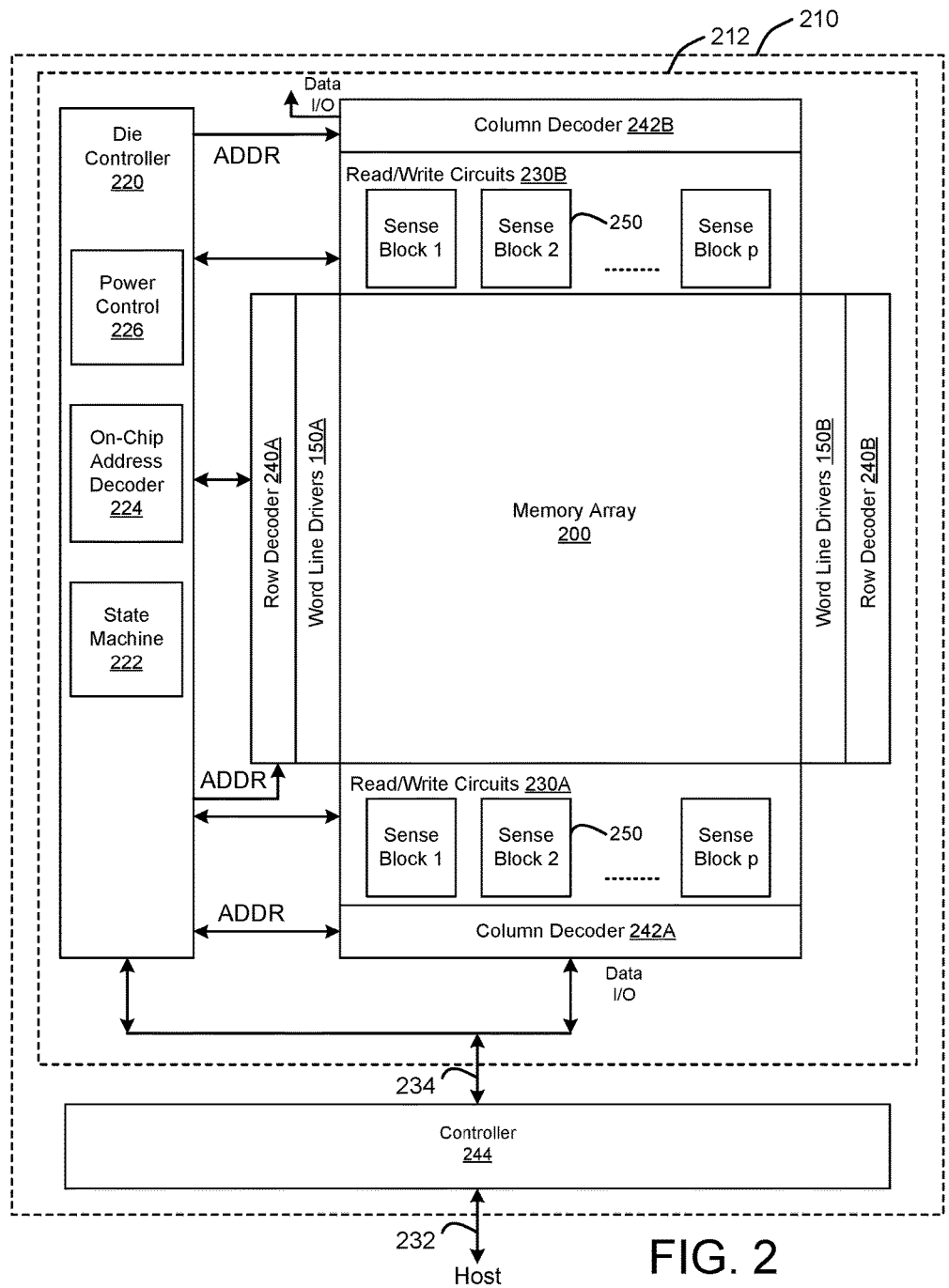
FIG. 2 is a schematic block diagram illustrating one embodiment of a non-volatile storage device comprising word line drivers.

FIG. 2 illustrates an embodiment of a non-volatile storage device 210 that may include one or more memory die or chips 212. The non-volatile storage device 210 may be substantially similar to the non-volatile memory device 120 described with reference to FIG. 1. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a state machine 222, an on-chip address decoder 224, and a power control circuit 226.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage. The word line drivers 150A, 150B, which may be substantially similar to the word line drivers 150 described above with regard to FIG. 1, may produce, provide, control, and or drive word line voltages to word lines based on decoding of addresses by row decoders 240A, 240B.

Figure 3:
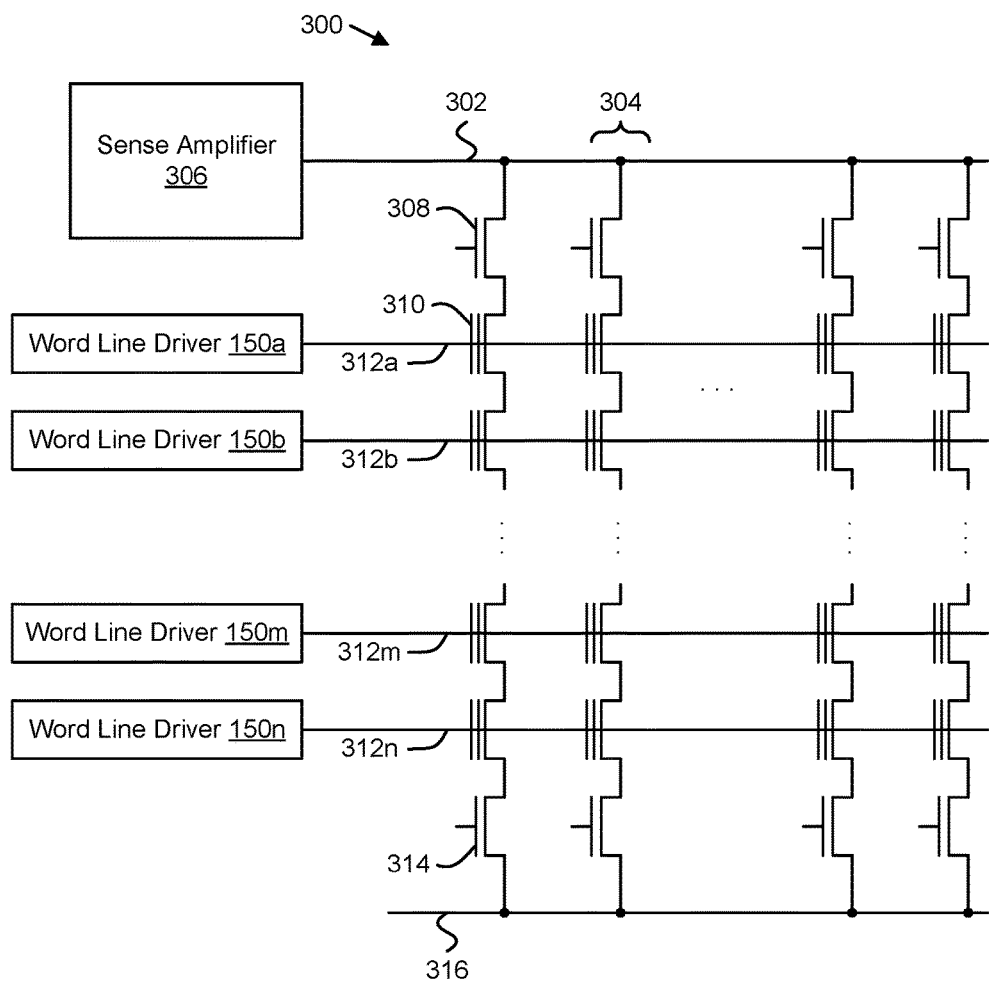
FIG. 3 is a schematic diagram illustrating one embodiment of an apparatus for accessing non-volatile memory.

FIG. 3 depicts one embodiment of an apparatus 300 for accessing non-volatile memory. In the depicted embodiment, the apparatus 300 includes a bit line 302, one or more NAND strings 304, a sense amplifier 306, word lines 312, word line drivers 150, and a source line 316. The word line drivers 150 may be substantially similar to the word line drivers 150 described above with regard to FIGS. 1 and 2. The sense amplifier 306 may be part of a sense block 250 and the NAND strings may be part of a memory array 200, as described above with regard to FIG. 2.

In the depicted embodiment, a NAND string 304 includes a plurality of floating gate transistors 310. In a floating gate transistor 310, a conductive "floating" gate is positioned over a channel region of a semiconductor substrate, between source and drain regions. A control gate is positioned over the floating gate. The floating gate is electrically isolated (e.g., by oxide layers) from the control gate and the substrate, and may store a charge. The charge on a floating gate may be increased (e.g., during programming) or decreased (e.g., during erasure) by Fowler-Nordheim tunneling, hot carrier injection, or the like. Because the floating gate is between the control gate and the substrate, the amount of charge on the floating gate may affect the "threshold voltage" $V_t$ that is sufficient to turn the floating gate transistor 310 "on" (e.g., to create a conductive channel between source and drain regions) when applied to the control gate. Thus, the amount of charge on the floating gate, or, equivalently, the threshold voltage $V_t$ for the floating gate transistor 310 may be manipulated to store data.

In one embodiment, in "single level cell" (SLC) NAND flash memory, a single read voltage threshold may be established for a floating gate transistor 310, so that the floating gate transistor 310 is in an erased state (e.g., storing a binary "1") if the threshold voltage $V_t$ for the cell is below the read voltage threshold, and in a programmed state (e.g., storing a binary "0") if the threshold voltage $V_t$ for the cell is above the read voltage threshold. In another embodiment, for "multi level cell" (MLC), "triple level cell" (TLC) NAND flash memory, or the like, a range of possible threshold voltages $V_t$ for a floating gate transistor 310 may be divided into multiple states, so that the floating gate transistor 310 stores more than one bit of data. In general, in various embodiments, reading data from a floating gate transistor 310 may include determining which state the threshold voltage $V_t$ of the floating gate transistor 310 is in, by applying a read voltage to the control gate and determining whether the floating gate transistor 310 conducts between source and drain terminals. Similarly, writing data to a floating gate transistor 310 may include applying program voltage pulses to the control gate, or applying erase voltage pulses to the substrate, to change the threshold voltage $V_t$ of the floating gate transistor 310. A word line driver 150 may apply a read voltage, a program voltage pulse, or the like, to a control gate of a floating gate transistor 310.

Although data is stored in floating gate transistors 310 in the depicted embodiment, data in another embodiment may be stored by varying certain physical properties of other types of electrical components. For example, data may be stored by varying the resistance of a component in ReRAM, the phase of a component in PCM, or the like. A component, such as a floating gate transistor 310, with a physical property that may be altered to store data may be referred to herein as a "storage cell," a "memory cell" or the like. Thus, in the depicted embodiment, the memory array 200 of FIG. 2 may include multiple storage cells, comprising floating gate transistors 310 in NAND strings 304. In another embodiment, however, the memory array 200 of FIG. 2 may include multiple storage cells of another type.

In the depicted embodiment, a NAND string 304 includes a series of floating gate transistors 310, daisy chained source-to-drain. A source select transistor 314 couples the source end of the NAND string 304 to a source line 316, and a drain select transistor 308 couples the drain end of the NAND string 304 to a bit line 302. In a certain embodiment, the source line 316 may be maintained at a source voltage $V_{SS}$ (e.g., 0 V, or ground), and the bit line 302 voltage may be manipulated by the sense amplifier 306 to read or write data. Word lines 312 may couple control gates of corresponding floating gate transistors 310 across multiple NAND strings 304. Thus, a full row of floating gate transistors 310 (e.g., a page of data for SLC NAND, or multiple pages of data for MLC or TLC NAND) may be addressed via a single word line 312, with individual bits read or programmed via columns or bit lines 302. In the depicted embodiment, a 3-dimensional NAND arrangement is shown, in which multiple NAND strings 304 are coupled to one bit line 302, and a bit stored by a floating gate transistor 310 is physically addressed by row (e.g., word line 312), column (e.g., bit line 302), and string 304, (e.g., selected via select transistors 308, 314). In another embodiment, in a 2-dimensional NAND arrangement, each NAND string 304 is coupled to a single bit line 302, and a bit stored by a floating gate transistor 310 is physically addressed by row (e.g., word line 312), and column (e.g., bit line 302), without separately addressing a string 304.

In the depicted embodiment, as described above, reading data from a floating gate transistor 310 may include applying a read voltage to the control gate of the floating gate transistor 310 and determining whether the floating gate transistor 310 conducts between source and drain terminals. When reading or writing data for a floating gate transistor 310, the term "selected" may be used herein to refer to the floating gate transistor 310 in question, the NAND string 304 that includes the selected floating gate transistor 310, the word line 312 coupled to the selected floating gate transistor 310, and the like. Conversely, the term "unselected" may be used herein to refer to floating gate transistors 310 other than the selected floating gate transistor 310, NAND strings 304 other than the selected NAND string 304, word lines 312 other than the selected word line 312, and the like.

In one embodiment, to read data from a selected floating gate transistor 310, the sense amplifier 306 precharges the selected bit line 302. The source select transistor 314 and the drain select transistor 308 for a selected string 304 may be turned on (e.g., a voltage may be applied to control gates so that the select transistors 308, 314 are in a conducting state). Select transistors 308, 314 for unselected strings 304 may be turned off (e.g., control gates may be at 0 V). A voltage sufficient to fully turn on the unselected floating gate transistors 310 is applied by word line drivers 150 for the unselected word lines 312. A read voltage is applied to the selected floating gate transistor 310 by a word line driver 150, via the selected word line 312. If the threshold voltage $V_t$ for the selected floating gate transistor 310 is below the applied read voltage (e.g., the storage cell is in an erased state for SLC NAND), then the selected floating gate transistor 310 conducts, and the bit line 302 is discharged via the selected NAND string 304 coupling the bit line 302 to the source line 316. Conversely, if the voltage threshold $V_t$ for the selected floating gate transistor 310 is above the applied read voltage (e.g., the storage cell is in a programmed state for SLC NAND), then the selected floating gate transistor 310 does not conduct, and the selected NAND string 304 does not discharge the bit line 302. The sense amplifier 306 may sense an electrical property of the bit line 302, such as a bit line voltage, a rate of change in a bit line voltage, a bit line current, or the like, to determine whether the bit line 302 discharges through the selected floating gate transistor 310.

Applying a single read voltage may be sufficient to distinguish between programmed and erased states for SLC NAND; successive read voltages may be applied to distinguish between multiple states for MLC NAND, TLC NAND, or the like. As the number of states per cell increases, the number of read voltages that are applied to distinguish between the states may similarly increase. In one embodiment, a word line driver 150 may apply a series of fixed read voltages to floating gate transistors 310 on a selected word line 312, and sense amplifiers 306 may sense electrical properties of bit lines 302 coupled to the floating gate transistors 310 to determine which storage cells are in which states. However, the time for sensing at each read voltage may increase the latency of a read operation. Thus, in another embodiment, a word line driver 150 may apply a ramping voltage (e.g., a voltage signal that increases linearly from 0 V to 12 V, or the like) to floating gate transistors 310 on a selected word line 312, and sense amplifiers 306 may determine when (or at what voltage) the corresponding bit lines 302 discharge. In certain embodiment, sensing bit line 302 properties while applying a ramping voltage signal to a word line 312 may determine the state of multiple cells, and may avoid increased latency that would be associated with performing a separate sense operation at multiple read voltages.

In a certain embodiment, for writing as for reading, a string 304 may be selected by applying appropriate voltages to select transistors 308, 314, and unselected floating gate transistors 310 may be fully turned on by applying a sufficient voltage to unselected word lines 312. One or more program voltage pulses may be applied to the control gate for the selected floating gate transistor 310, via the selected word line 312, to change the voltage threshold $V_t$ for the selected floating gate transistor 310. Changes to the voltage threshold $V_t$ for the selected floating gate transistor 310 may be verified in a process similar to reading, by applying one or more program verify voltages (or a ramping program verify voltage signal) to the selected floating gate transistor 310, and sensing whether (or when) the selected floating gate transistor 310 conducts.

In various embodiments, the degree to which a voltage threshold $V_t$ for a selected floating gate transistor 310 changes in response to a programming pulse depends on the size of voltage between the control gate and the drain. In one embodiment, to inhibit a cell from being programmed, a sense amplifier 306 may apply a high inhibit voltage to the drain of the selected floating gate transistor 310, via the bit line 302. In another embodiment, for fast programming, or for programming to a high voltage threshold $V_t$, a sense amplifier 306 may apply a low or zero voltage to the drain of the selected floating gate transistor 310, via the bit line 302. In certain embodiments, a sense amplifier 306 may apply a bias voltage to the drain of the selected floating gate transistor 310, via the bit line 302. In some embodiments, a small, but non-zero bias voltage may reduce program disturb phenomena that affect floating gate transistors 310 in nearby or adjacent unselected NAND strings 304. In further embodiments, a bias voltage at some level between zero volts and the inhibit voltage may effectively reduce the size of the program voltage pulses, by reducing the voltage difference between the control gate and the drain of the selected floating gate transistor 310, to slow programming, or to program the selected floating gate transistor 310 into a state with an intermediate threshold voltage $V_t$.

Read and program operations are described above in the context of reading or writing data to a single floating gate transistor 310. However, in various embodiments, a word line 312 may couple control gates for a row of floating gate transistors 310 that spans multiple NAND strings 304 and bit lines 302. Thus, a read voltage or a program voltage pulse may be applied to a word line 312, and multiple bits of data may be communicated via multiple bit lines 302, to read data from or write data to floating gate transistors 310 coupled to the selected word line 312. In some embodiments, a subset of floating gate transistors 310 coupled to the selected word line 312 may be unselected. For example, in one embodiment, strings 304 may still be individually selected as described above if multiple strings 304 are coupled to one bit line 302. In certain embodiments, a partial row may be programmed by selecting only even bit lines 302, only odd bit lines 302, or the like. However, in general, in various embodiments, data is programmed to or read from multiple floating gate transistors 310 in a row using one word line 312 and multiple bit lines 302.

To read a page of data, a read voltage may be applied to a word line 312, and sense amplifiers 306 may determine which bit lines 302 are discharged through floating gate transistors 310 coupled to the word line 312. In certain embodiment, where the range of possible threshold voltages $V_t$ for a floating gate transistor 310 is divided into more than two states, multiple pages of data may be read from the same row of floating gate transistors 310 by applying successive read voltages or a ramping read voltage signal to the word line 312.

Similarly, to program a page of data, one or more program pulses may be applied to a word line 312 and sense amplifiers 306 may apply different voltages to different bit lines 302 to program or inhibit floating gate transistors 310 coupled to the word line 312. In one embodiment, multiple pages of data may be programmed to the same row of floating gate transistors 310 by applying inhibit voltages to different bit lines 302 at different times, or by applying different bias voltages to different bit lines 302 to affect programming speeds, so that different floating gate transistors 310 are programmed into different states.

In the depicted embodiment, the floating gate transistors 310 are NAND flash storage cells. However, in various embodiments, word lines 312 and bit lines 302 for other types of storage cells including resistive storage cells, magnetic storage cells, phase change storage cells, or the like, may be similarly arranged so that so that word line drivers 150 apply voltages (or other electrical signals) to rows of non-volatile storage cells. Word line drivers 150 are described in further detail below with regard to FIGS. 4-8.

Figure 4:
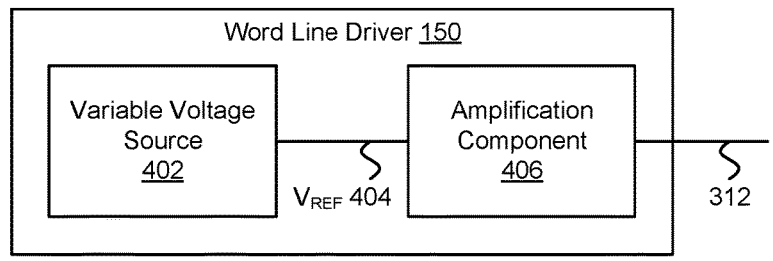
FIG. 4 is a schematic block diagram illustrating one embodiment of a word line driver.

FIG. 4 depicts one embodiment of a word line driver 150. The word line driver 150 may be substantially similar to the word line drivers 150 described above with regard to FIGS. 1-3. In the depicted embodiment, the word line driver 150 includes a variable voltage source 402 and an amplification component 406. In general, as described above, the word line driver 150 is coupled to a word line 312 (which may be substantially similar to the word lines 312 described above with regard to FIG. 3) to produce a word line voltage. As used herein, a "word line voltage" may refer to any voltage signal applied to a word line 312, such as a fixed read voltage, a ramping read voltage, a program voltage pulse, a program verify voltage, a program verify voltage ramp, or the like.

In general, in various embodiments, the variable voltage source 402 produces a reference voltage 404, and the amplification component 406 amplifies the reference voltage 404 and applies the amplified voltage to the word line 312. In various embodiments, a variable voltage source 402 may include any electrical component capable of being controlled to output a variable voltage, such as a voltage based digital-to-analog converter ("DAC") which controls an analog voltage output based on a digital input, a potentiometer configured as a voltage divider, a controllable voltage regulator, or the like. Many types of components that output a variable voltage will be clear in view of this disclosure.

In the depicted embodiment, the output of the variable voltage source 402 is a reference voltage $V_{REF}$ 404, which is received and amplified by the amplification component 406. In one embodiment, $V_{REF}$ 404 may be a (piecewise) flat or constant voltage signal, which is amplified by the amplification component 406 to produce a fixed word line voltage (e.g., a read voltage). In a further embodiment, the variable voltage source 402 may be controlled to change the reference voltage $V_{REF}$ 404, so that multiple read voltages may be produced by the word line driver 150. In another embodiment, the variable voltage source 402 may be configured to produce a ramping voltage signal as the reference voltage $V_{REF}$ 404, so that the word line driver 150 produces a ramping word line voltage.

In various embodiments, the amplification component 406 may include one or more electrical components configured to amplify the reference voltage $V_{REF}$ 404. For example, the amplification component 406 may include a differential amplifier, an operational amplifier ("op amp"), an instrumentation amplifier, or the like. Various electrical components suitable for amplifying a reference voltage $V_{REF}$ 404 will be clear in view of this disclosure. One embodiment of an amplification component 406 is described in further detail below with regard to FIG. 7.

Figure 5:
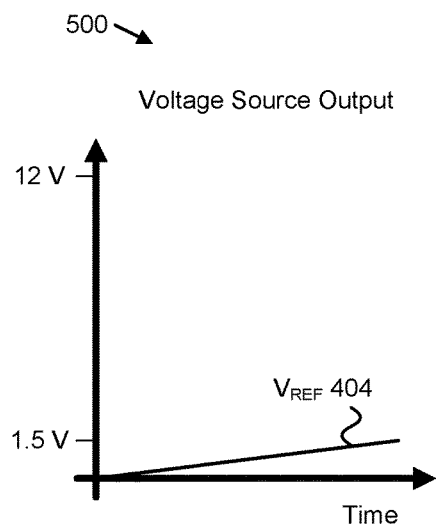
FIG. 5 is a graph illustrating one embodiment of a voltage from a variable voltage source.
Figure 6:
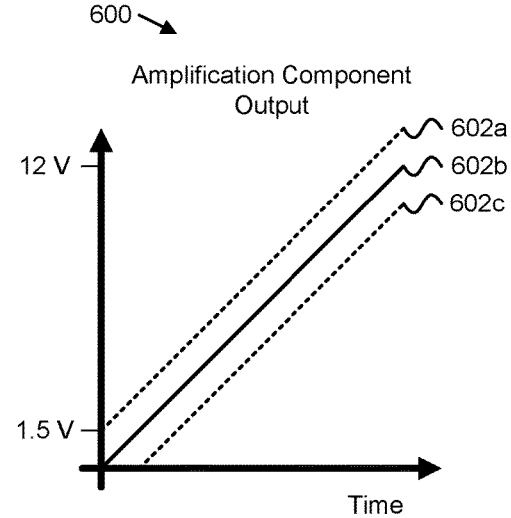
FIG. 6 is a graph illustrating one embodiment of an output voltage from an amplification component.

FIG. 5 and FIG. 6 are graphs 500, 600 illustrating the output voltages from the variable voltage source 402 and the amplification component 406 of FIG. 4, respectively. In FIG. 5, graph 500 depicts one embodiment of a reference voltage $V_{REF}$ 404 produced by the variable voltage source 402. In the depicted embodiment, the reference voltage $V_{REF}$ 404 is a ramping voltage signal that ramps linearly from 0 V to 1.5 V. In various embodiments, a "ramping" voltage signal may refer to any voltage signal that increases or decreases from an initial voltage to a final voltage. For example, in one embodiment, a ramping voltage signal may increase linearly. In another embodiment, a ramping voltage signal may increase logarithmically. In a certain embodiment, a ramping voltage signal produced by a DAC may increase in piecewise constant steps as a digital input to the DAC increases. (In a further embodiment, a low-pass filter may smooth a voltage signal produced by a DAC to avoid high harmonics, or to produce a more approximately linear signal). In certain embodiments, a ramping voltage signal may decrease, rather than increasing. Various types of ramping voltage signals will be clear in view of this disclosure.

In FIG. 6, graph 600 depicts various embodiments of an output voltage 602 produced by the amplification component 406, corresponding to the reference voltage $V_{REF}$ 404 in FIG. 5. In the depicted embodiment, output voltage 602b represents the output of an amplification component 406 without positive or negative offset. In the depicted embodiment, the amplification component 406 has a gain of 8, so the reference voltage $V_{REF}$ 404 that ramps from 0 V to 1.5 V is amplified to become an output voltage that ramps from 0 V to 12 V. In another embodiment, the gain of the amplification component 406 may be higher or lower than in the depicted embodiment. The output voltage 602b is applied to the word line 312. As described above with regard to FIG. 3, applying a ramping voltage signal to a word line 312 allows the state of cells coupled to the word line to be determined, for reading data. For example, for NAND memory cells where data is stored by manipulating the threshold voltage $V_t$ of floating gate transistors, the threshold voltages $V_t$ for a row of memory cells may be determined by applying a ramping voltage signal to control gates of the floating gate transistors via a word line 312, and determining when (or at what voltage) each floating gate transistor conducts (e.g., by sensing when corresponding bit lines are discharged). States of certain other types of memory cells may similarly be sensed by applying a ramping voltage signal to a word line 312.

In a certain embodiment, the range of possible threshold voltages $V_t$ for NAND memory cells (or of another data-encoding physical property for another type of memory cell) may be divided into a number of states, corresponding to the number of bits stored by the cell. For example, for storing four bits per cell, a range of threshold voltages $V_t$ may be divided into sixteen states, so that each state corresponds to one of the sixteen possible binary values from 0000 to 1111. In a further embodiment, applying a ramping word line voltage to determine the threshold voltage $V_t$ of a cell may be significantly faster than performing fifteen individual sense operations for fifteen different read voltages (at boundary voltages between states) to determine the state of the cell.

In certain embodiments, increasing the number of states per cell, to store more data, may decrease the size of the states. For example, if a NAND memory cell may have a threshold voltage $V_t$ somewhere between 0 V and 12 V, then dividing the range of possible threshold voltage $V_t$ into sixteen states to store four bits per cell results in states that are 0.75 V wide. With each state occupying a narrow voltage range, a small error in the applied read voltage may result in misidentifying the state of a cell, causing data errors.

In the graph 600, output voltage 602a represents the output of an amplification component 406 with positive offset. Similarly, output voltage 602c represents the output of an amplification component 406 with negative offset. In general, in various embodiments, an amplifier offset may refer to a difference between an expected and an actual output voltage. The offset may refer to an actual voltage difference at an output, or may be "input referred" to refer to the size of a voltage change at an amplifier input that would compensate for the difference at the output. (Input referred offsets may be particularly useful for describing offsets caused by asymmetries between differential inputs). Various polarity conventions exist for referring to offsets. For example, the offset of one amplifier may be described as an input-referred offset in two different ways, with opposite polarities, to describe a compensating voltage change at an inverting input or a non-inverting input of the amplifier. As used herein, a "positive" offset refers to an offset where the output voltage of an amplifier is higher than an expected, desired, or target voltage, and a "negative" offset refers to an offset where the output voltage of an amplifier is lower than an expected, desired, or target voltage. However, the convention used herein for describing the polarity of an offset is for convenience in description, and is not intended as limiting.

In various embodiments, an offset may be caused by various factors internal or external to an amplification component 604. For example, the positive offset of output voltage 602a or the negative offset of output voltage 602c may be caused by internal asymmetries of the amplification component 604. Alternatively, the positive offset of output voltage 602a or the negative offset of output voltage 602c may be caused by external or system factors. For example, the reference voltage $V_{REF}$ 404 produced by the variable voltage source 402 may actually be higher or lower than depicted in the graph 500 of FIG. 5.

In either case, applying an output voltage 602 from an amplifier component 406 to a word line may lead to errors in sensing the state of a cell (either for reading data or for verifying that a cell has been programmed to the right state) if the output voltage 602 is offset from an expected or target voltage. For example, in the graph 600, the expected or target output voltage 602b is represented by a solid line. The target output voltage 602b may be "expected" in the sense that it is the specified output of the amplification component 406. In a further embodiment, other components may rely on the specified, target, or expected output of the amplification component 406. For example, determining the threshold voltage $V_t$ for a non-volatile memory cell may involve identifying the specified output voltage 602b from the amplification component 406 at a time when a bit line is discharged through the non-volatile memory cell. If the actual output voltage 602 is higher or lower than the specified output voltage 602b, the state of the cell may be misidentified.

In certain embodiments, it may be difficult to detect or compensate for an amplifier offset at certain voltages. For example, an amplifier may be in a saturated state (e.g., at a maximum or minimum output voltage) with a 0 V input, due to a high gain applied to even a very small input-referred offset. The saturated output may indicate the polarity of the input-referred offset, but not the size of the input-referred offset. Certain types of amplifiers, such as complementary metal-oxide-semiconductor ("CMOS") amplifiers, may produce output voltages with a maximum output voltage at or near a positive supply voltage, and a minimum output voltage at or near 0 V. In further embodiments, it may be difficult to determine whether a 0 V output voltage is due to a 0 V input, or whether an amplifier is in a saturated state at 0 V caused by a negative offset. For example, in the depicted embodiment in graph 600, the output of the amplification component 406 is clamped at a 0 V minimum voltage, so the output voltage 602c with a negative offset remains at zero volts until the reference voltage $V_{REF}$ 404 is high enough to produce a positive output voltage 602c despite the negative offset. Trimming output offsets (e.g., output voltages 602a, 602c) for an amplification component 406 is described in further detail below with regard to FIGS. 7-9.

Figure 7:
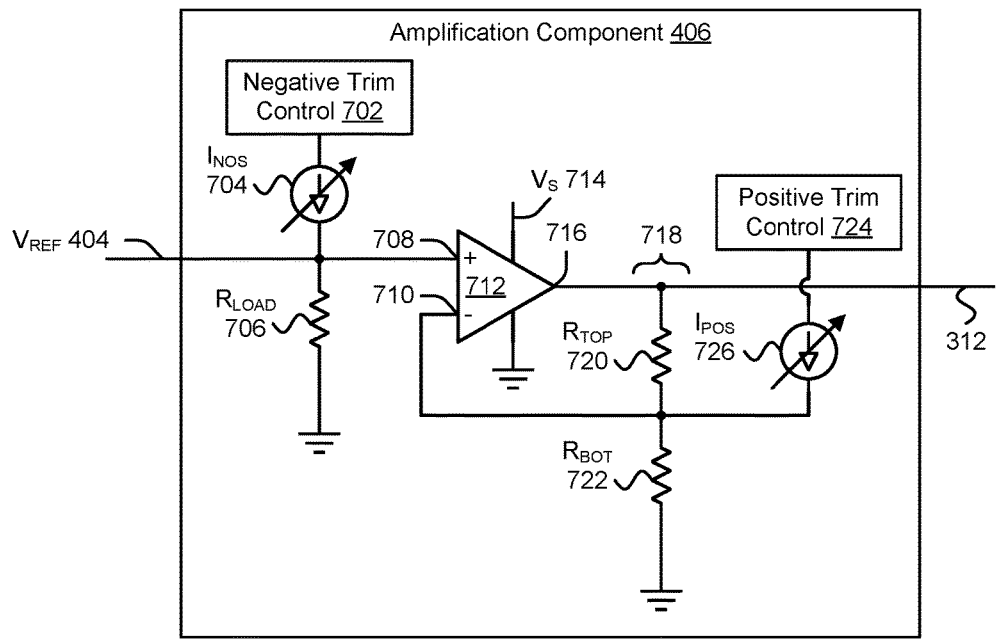
FIG. 7 is a schematic diagram illustrating one embodiment of an amplification component.

FIG. 7 depicts one embodiment of an amplification component 406. The amplification component 406 may be substantially similar to the amplification component 406 described above with regard to FIGS. 4-6. In general, as described above, the amplification component amplifies a reference voltage $V_{REF}$ 404 (e.g., from variable voltage source 402), and applies the amplified reference voltage to a word line 312. In the depicted embodiment, the amplification component 406 include a differential amplifier 712, a first variable current source 704, and a second variable current source 726.

The differential amplifier 712, in one embodiment, comprises a non-inverting input 708, an inverting input 710, and an output 716. In general, in various embodiments, a differential amplifier 712 amplifies a voltage difference between the non-inverting input 708 and the inverting input 710. Thus, in certain embodiments, a "non-inverting" input 708 may refer to an input of a differential amplifier 712 where increasing the voltage at the non-inverting input 708 increases the voltage at the output 716 (if the output voltage is not already at a maximum). Similarly, in further embodiments, an "inverting" input 710 may refer to an input of a differential amplifier 712 where increasing the voltage at the inverting input 710 decreases the voltage at the output 716 (if the output voltage is not already at a minimum). In certain embodiments, a differential amplifier 712 may be a fully differential amplifier (with differential outputs), an operational amplifier (with high gain and a single-ended output 716), another type of electronic amplifier, or the like. In the depicted embodiment, the differential amplifier 712 is an operational amplifier ("op amp"). Various other or further types of differential amplifiers 712 suitable for use in an amplification component 406 will be clear in view of this disclosure.

In general, for an ideal differential amplifier 712, the voltage at the output 716 is equal to an open-loop gain for the amplifier 712, multiplied by the differential input voltage (e.g., the voltage at the non-inverting input 708 minus the voltage at the inverting input 710). In certain embodiments, the voltage at the output 716 may be limited to maximum and minimum values, at which points the output 716 or the amplifier 712 may be referred to as "saturated." Certain types of differential amplifiers 712 may be saturated at maximum and minimum voltages at or near high and low supply voltages. In the depicted embodiment, the amplifier 712 is coupled to a positive supply voltage Vs 714, and to ground (defined to be 0 V). In a further embodiment, the output 716 may be saturated at a maximum voltage at or near the positive supply voltage Vs 714, or at a minimum voltage at or near 0 V. In one embodiment, the amplifier 712 may be a complementary metal-oxide-semiconductor ("CMOS") amplifier with a minimum output voltage of zero volts. In another embodiment, the amplifier 712 may be another type of amplifier with a positive maximum output voltage and a negative minimum output voltage. In certain embodiments, the open-loop gain of an amplifier 712 may be very large, so that even a small differential input voltage saturates the output 716.

In general, for an ideal amplifier 712, the voltage at the output 716 would be zero volts when the voltage at the non-inverting input 708 is equal to the voltage at the inverting input 710. However, imperfections in the manufacturing or packaging processes may result in asymmetries between the non-inverting input 708 and the inverting input 710, so that the voltage at the output 716 is nonzero (or saturated at a minimum voltage of zero volts) when the voltages at the inputs 708, 710 match (e.g., the differential input voltage is zero). If the amplifier 712 has a large open-loop gain, the output 716 may even be saturated at a maximum or minimum output voltage when the voltages at the inputs 708, 710 match. An amplifier 712 with an output offset caused by internal asymmetry may be modeled as an ideal amplifier with a small voltage source $V_{OS}$ in series with one of the inputs 708, 710, so that the output voltage is zero when the differential input voltage is $V_{OS}$, rather than when the differential input voltage is zero. $V_{OS}$ may be referred to as an "input referred" offset voltage for the amplifier, because it indicates an input voltage that compensates for an offset at the output 716.

In a further embodiment, an output offset caused by factors external to the amplifier 712 may similarly be modeled as a small voltage source in series with one of the inputs 708, 710. For example, in the current embodiment, because the input voltage $V_{REF}$ 404 is coupled to the non-inverting input 708, an error in the input voltage $V_{REF}$ 404 may be modeled as a small voltage source in series with the non-inverting input 708.

In certain embodiments, the output 716 of a differential amplifier 712 may be directly or indirectly coupled to the inverting input 710, to provide negative feedback. In a further embodiment, with the inverting input 710 controlled by the output 716, the voltages at the output 716 and at the inverting input 710 may both be based on the voltage at the non-inverting input 708. In particular, if the voltage at the non-inverting input 708 is fixed (e.g., at $V_{REF}$ 404) and the output 716 is not saturated, then a stable equilibrium exists where the voltage at the output 716 pulls the voltage at the inverting input 710 to a point where the differential input voltage is consistent with the output voltage. In certain embodiments, where an amplifier 712 has a very large open-loop gain, any voltage at a non-saturated output 716 may indicate that the differential input voltage is very small, and the voltage at the inverting input 710 is approximately equal to the voltage at the non-inverting input 708 (plus or minus any internal input-referred offset voltage $V_{OS}$).

In the depicted embodiment, the output 716 is coupled to the inverting input 710 via a voltage divider 718. In general, in various embodiments, a voltage divider 718 may include any passive circuit that produces an output voltage at a fraction of an input voltage. In further embodiments, a voltage divider 718 may include two impedances in series, where an input voltage is applied across both impedances, and the output is the voltage across one of the impedances. In the depicted embodiment, where the amplifier 712 provides a DC voltage to a word line 312, the voltage divider 718 comprises two resistors 720, 722. In another embodiment, where an amplifier 712 provides an oscillating voltage (e.g., to drive a load other than a word line 312), impedances of a voltage divider 718 may include resistors capacitors, inductors, or the like.

In the depicted embodiment, the voltage divider 718 includes a top resistor 720, with a resistance $R_{TOP}$, coupled in series to a bottom resistor 722, with resistance $R_{BOT}$. Terms such as "top," "bottom," and "middle" are used herein for convenience in referring to a voltage divider 718, without implying an actual spatial orientation. For example, the top resistor 720 may still be referred to as a "top" resistor even if the amplification component 406 (including the voltage divider 718) is turned upside down. As used herein, the "bottom" of a voltage divider 718 is coupled directly to ground (or another reference voltage), the "middle" is coupled to the bottom via the bottom resistor 722, and the "top" is coupled to the middle via the top resistor 720. Thus, the voltage difference between the top and the bottom of the voltage divider 718 is the sum of the voltage differences across the top resistor 720 and the bottom resistor 722, and the voltage difference between the middle and the bottom of the voltage divider 718 is the voltage across the bottom resistor 722 alone.

In the depicted embodiment, the top of the voltage divider 718 is coupled to the output 716 of the amplifier 712, and the middle of the voltage divider 718 is coupled to the inverting input 710 of the amplifier 712. As described above, the feedback from the output 716 to the inverting input 710 (via the voltage divider 718) may bring the voltage at the inverting input 710 very close to the input voltage $V_{REF}$ 404 at the non-inverting input 708 (plus or minus an internal input-referred offset voltage $V_{OS}$). Thus, the current through the bottom resistor 722 is approximately $V_{REF}/R_{BOT}$. In various embodiments, input impedance of the amplifier 712 at the inverting input 710 may be high, so that the current through the inverting input 710 is approximately zero. Thus, in a further embodiment, in the absence of current from the second variable current source 726 (e.g., without offset trimming), the current through the bottom resistor 722 may equal the current through the top resistor 720, so that the voltage drop across the top resistor 720 is $V_{REF}*R_{TOP}/R_{BOT}$, and the voltage at the top of the voltage divider 718 (e.g., the output voltage of the amplifier 712) is $V_{REF}*(1+R_{TOP}/R_{BOT})$. Thus, in the depicted embodiment, without offset trimming, the closed-loop gain of the amplifier 712 is $(1+R_{TOP}/R_{BOT})$. The top resistor 720 and the bottom resistor 722 may be selected by a manufacturer of the amplification component so that the individual resistances $R_{TOP}$ and $R_{BOT}$ are significantly less than the input impedance of the amplifier 712 at the inverting input 710, and so that the ratio of resistances provides the desired closed-loop gain.

However, in certain embodiments, the voltage at the output 716 of the amplifier 712 may be higher or lower than a target voltage. For example, the voltage at the inverting input 710 may be higher or lower than the input voltage $V_{REF}$ 404 at the non-inverting input 708 by an input offset voltage $V_{OS}$, causing the voltage at the output 716 to be correspondingly higher or lower. Similarly, system offsets may be caused by $V_{REF}$ 404 being higher or lower than a target input voltage for the target output voltage, by imprecise resistances for the top resistor 720 or the bottom resistor 722, or the like. In certain embodiments, an offset may exist without affecting the output voltage at a particular input voltage. For example, if the minimum output voltage is zero and the input voltage $V_{REF}$ 404 is zero, a negative offset may not decrease the output voltage any further, but may become apparent if the minimum output voltage is still zero when the input voltage $V_{REF}$ 404 is small but positive.

In general, in various embodiments, the first variable current source 704, with current $I_{NOS}$, is configured to compensate for a negative offset (e.g., an output voltage lower than expected). In certain embodiments, increasing the current $I_{NOS}$ from the first variable current source 704 increases a voltage at the non-inverting input 708 of the amplifier 712. For example, in the depicted embodiment, the first variable current source 704 is coupled directly to the non-inverting input 708, and indirectly to ground via a load resistance $R_{LOAD}$. In FIG. 7, the load resistance $R_{LOAD}$ is depicted as a discrete resistor 706 within the amplification component. However, in various embodiments, the load resistance $R_{LOAD}$ may be an effective, equivalent, or resultant resistance for a current path between the non-inverting input 708 and another circuit node internal or external to the amplification component 406. For example, in one embodiment, the load resistance $R_{LOAD}$ may comprise an output impedance of the variable voltage source 402 that produces the input voltage $V_{REF}$ 404.

In a certain embodiment the current $I_{NOS}$ from the first variable current source 704 increases the current through the load resistance $R_{LOAD}$, which in turn increases the input voltage $V_{REF}$ 404 at the non-inverting input 708 of the amplifier 712 by $I_{NOS}*R_{LOAD}$. Consequently, after amplification, the output voltage of the amplifier 712 is increased by $I_{NOS}*R_{LOAD}*(1+R_{TOP}/R_{BOT})$. Thus, increasing the current $I_{NOS}$ from the first variable current source 704 increases the voltage at both the non-inverting input 708 and the output 716 of the amplifier. Accordingly, in various embodiments, a negative offset for the amplifier 712 may be trimmed or compensated for by providing a positive current $I_{NOS}$ from the first variable current source 704 to increase the output voltage.

Correspondingly, in various embodiments, the second variable current source 726, with current $I_{POS}$, is configured to compensate for a positive offset (e.g., an output voltage higher than expected). In certain embodiments, the second variable current source 726 is coupled to the inverting input 710, and to the output 716 via the voltage divider 718, such that increasing a current $I_{POS}$ from the second variable current source 726 decreases a voltage at the output 716 of the amplifier 712. For example, in the depicted embodiment, the second variable current source 726 is coupled to the middle of the voltage divider 718, so that the bottom resistor 722 couples the second variable current source 726 to ground, and the top resistor 720 couples the second variable current source 726 to the output. As described above, the current through the bottom resistor 722 is $V_{REF}/R_{BOT}$, based on the voltage at the inverting input 710 approximately matching the voltage input voltage $V_{REF}$ 404 at the non-inverting input 708 due to negative feedback. However, in a further embodiment that current $V_{REF}/R_{BOT}$ through the bottom resistor 722 is the sum of the current through the top resistor 720 and the current $I_{POS}$ from the second variable current source 726. Thus, providing a current $I_{POS}$ from the second variable current source 726 decreases the current through the top resistor 720, and decreases the voltage at the output 716 by $I_{POS}*R_{TOP}$. Accordingly, in various embodiments, a positive offset for the amplifier 712 may be trimmed or compensated for by providing a positive current $I_{POS}$ from the second variable current source 726 to decrease the output voltage.

In various embodiments, the variable current sources 704, 726 may include any electrical components capable of being controlled to produce a variable current, such as a current-based digital-to-analog converter ("DAC") which controls an analog current output based on a digital input, set of current mirrors that can be individually coupled or decoupled from an input current, or the like. Many types of components that output a variable current will be clear in view of this disclosure. In further embodiments, negative trim control 702 and positive trim control 724 control the currents $I_{NOS}$ and $I_{POS}$ from the first voltage source 704 and the second voltage source 726, respectively. In various embodiments, the trim controls 702, 724 may include any electrical components capable of controlling the variable current sources 704, 726. For example, in one embodiment, one or more of the current sources 704, 726 may include a thermometer-coded DAC that couples varying numbers of individual fixed-current sources to an output, and the corresponding trim control(s) 702, 724 may include a thermometric (e.g., binary to unary) decoder that switches on the individual current sources based on a digital input. In FIG. 7, the positive and negative trim controls 702, 724 are depicted as separate components. However, in another embodiment, a single component may control the currents from both current sources 704, 726. For example, in one embodiment, a five-bit thermometric decoder may control 15 current sources in a DAC for the first voltage source 704 and an additional 15 current sources in a DAC for the second voltage source 726.

In a certain embodiment, for trimming a negative output offset, the current $I_{NOS}$ from the first variable current source 704 is set at a nonzero, positive value and the current $I_{POS}$ from the second variable current source 726 is set at zero. Thus, the output voltage is increased by $I_{NOS}*R_{LOAD}*(1+R_{TOP}/R_{BOT})$. In another embodiment, for trimming a positive output offset, the current $I_{NOS}$ from the first variable current source 704 is set at zero and the current $I_{POS}$ from the second variable current source 726 is set at a nonzero, positive value. Thus, the output voltage is decreased by $I_{POS}*R_{TOP}$.

In certain embodiments, the current $I_{NOS}$ from the first variable current source 704 and the current $I_{POS}$ from the second variable current source 726 may be controlled in predetermined increments, where the predetermined increments are fixed size steps. In a further embodiment, the resistances $R_{LOAD}$ and $R_{TOP}$ may be configured (e.g., the ratio between $R_{LOAD}$ and $R_{TOP}$ may be selected by a manufacturer) so that an output voltage change from increasing the current $I_{NOS}$ from the first variable current source 704 by a predetermined increment is equal to an output voltage change from decreasing the current $I_{POS}$ from the second variable current source 726 by the same predetermined increment. For example, the output voltage change $I_{NOS}*R_{LOAD}*(1+R_{TOP}/R_{BOT})$ for negative offset trimming may be configured to be equal to the output voltage change for positive offset trimming $I_{POS}*R_{TOP}$ for currents of the same size by choosing an appropriate ratio $R_{LOAD}$ and $R_{TOP}$ (where the ratio between $R_{TOP}$ and $R_{BOT}$ is already fixed to establish the desired closed-loop gain). In another embodiment, the resistance $R_{LOAD}$ may be an output impedance of the variable voltage source 402 that produces the input voltage $V_{REF}$ 404, while $R_{TOP}$ and $R_{BOT}$ may be selected based on specifications of the differential amplifier 712, but the step or increment sizes for changing the currents $I_{NOS}$ and $I_{POS}$ may be independently selected so that an output voltage change from increasing the current $I_{NOS}$ from the first variable current source 704 by a first predetermined increment is equal to an output voltage change from decreasing the current $I_{POS}$ from the second variable current source 726 by a second predetermined increment. The second predetermined increment, in various embodiments, may be equal to or different from the first predetermined increment.

Additionally, in a certain embodiment, an output voltage change from changing the current $I_{NOS}$ from the first variable current source 704 and/or the current $I_{POS}$ from the second variable current source 726 is based on a ratio of temperature dependent resistances, such that the output voltage change is temperature independent. For example, in one embodiment, each current source 704, 726 may provide a current based on a temperature-independent voltage (e.g., a bandgap voltage reference), divided by a temperature-dependent base resistance, and multiplied by a variable amplification factor. Temperature coefficients of $R_{LOAD}$, $R_{TOP}$, and/or $R_{BOT}$ may be matched to the temperature coefficient of the base resistance, so that the temperature coefficients cancel and the output voltage change is temperature independent for negative and/or positive offset trimming.

In certain embodiments, trimming an amplifier offset using two current sources 704, 726 may provide for accurate trimming at near-zero input or output voltages. For example, in certain embodiments, an input voltage $V_{REF}$ 404 may be subject to a minimum voltage of 0 V. Thus, increasing the current $I_{NOS}$ from the first variable current source 704 may increase the input voltage $V_{REF}$ 404 to compensate for a negative output offset, but decreasing $I_{NOS}$, or providing a negative current $I_{NOS}$, may not decrease the input voltage $V_{REF}$ 404 to compensate for a positive output offset if the input voltage $V_{REF}$ 404 is already near zero. Additionally, certain methods of amplifier offset trimming may rely on voltages well above ground voltage (0 V) at both inputs. For example, trimming an amplifier by adjusting currents internal to the amplifier 712 may rely on voltages well above ground voltage (0 V) at both inputs to provide positive bias currents. By contrast, trimming an amplifier offset using two current sources 704, 726, as described herein, may allow accurate trimming with input voltages near zero.

In one embodiment, an integrated circuit die may include the differential amplifier 712, the first variable current source 704, and the second variable current source 726. For example, where the amplification component 406 is a component of a word line driver 150, a non-volatile memory die may include a plurality of word lines 312, a plurality of differential amplifiers 712 coupled to the word lines, a plurality of first variable current sources 704 for negative offset trimming, a plurality of second variable current sources 726 for positive offset trimming, and a plurality of variable voltage sources 402 that provide ramping voltage signals for amplification by the differential amplifiers 712. In another embodiment, an amplification component 406 with offset trimming may be used in a context outside a word line driver 150, but may nevertheless include the differential amplifier 712, the first variable current source 704, and the second variable current source 726 on a single integrated circuit die.

In certain embodiments, a current from one of the current sources 704, 726 may be zero while the current from the other current source 704, 726 is nonzero, depending on whether the amplifier 712 has a positive or negative offset. If the direction of the offset were known at the time of manufacturing, one of the current sources 704, 726 could be omitted. However, amplifier offsets may be positive or negative at random, based on random variations in the manufacturing process. Thus, providing both current sources 704, 726 on the same integrated circuit as the amplifier 712 allows for positive and/or negative offset trimming. In a further embodiment, a manufacturer of the integrated circuit die may set the current $I_{NOS}$ from the first variable current source 704 and the current $I_{POS}$ from the second variable current source 726. For example, the manufacturer of the integrated circuit die may measure amplifier offsets during die sorting, and may set the currents $I_{NOS}$ and $I_{POS}$ to trim the amplifier output voltage. In one embodiment, where the amplifier 712 is on the same integrated circuit die as the variable voltage source 402 that provides the input voltage $V_{REF}$ 404, offset trimming by a manufacturer may compensate for internal and/or system offsets simultaneously, without burdening the user with a further trimming process.

In general, in various embodiments, the process of trimming an amplifier offset may include setting the current $I_{NOS}$ from the first variable current source 704 and the current $I_{POS}$ from the second variable current source 726 to produce a target output voltage at the output 716 of the differential amplifier 712 in response to a preset input voltage. For example, in a certain embodiment, a preset input voltage $V_{REF}$ 404 may be selected so that the output voltage, in the absence of any offset, would equal a target output voltage. The currents $I_{POS}$ and $I_{NOS}$ may then be adjusted until the actual output voltage equals (or at least approximately equals) the target output voltage. In a certain embodiment (e.g., for a CMOS amplifier), a minimum output voltage for the amplifier 712 may be zero volts, and the target output voltage may be near zero. For example, the target output voltage may be 50 mV, or in a range between zero and 100 mV. With a low target output voltage, the input voltages may similarly be near zero, but the output offset may nevertheless be effectively trimmed as described herein.

In a certain embodiment, trimming may be done in a low voltage to high voltage direction. For example, the current $I_{POS}$ from the second variable current source 726 may be set to a maximum current while the current $I_{NOS}$ from the first variable current source 704 is set to zero, so that the output voltage is trimmed to a lowest trimmed output voltage (for the preset input voltage). The current $I_{POS}$ from the second variable current source 726 may then be reduced incrementally, until the output voltage is sufficiently close to the target voltage (e.g., the difference between the output voltage and the target voltage may be less than or equal to half of a step size for trimming the output voltage.) If the current $I_{POS}$ from the second variable current source 726 is reduced to zero without the output voltage becoming sufficiently close to the target voltage, then the current $I_{NOS}$ from the first variable current source 704 may be increased incrementally for further trimming of the output voltage.

Figure 8:
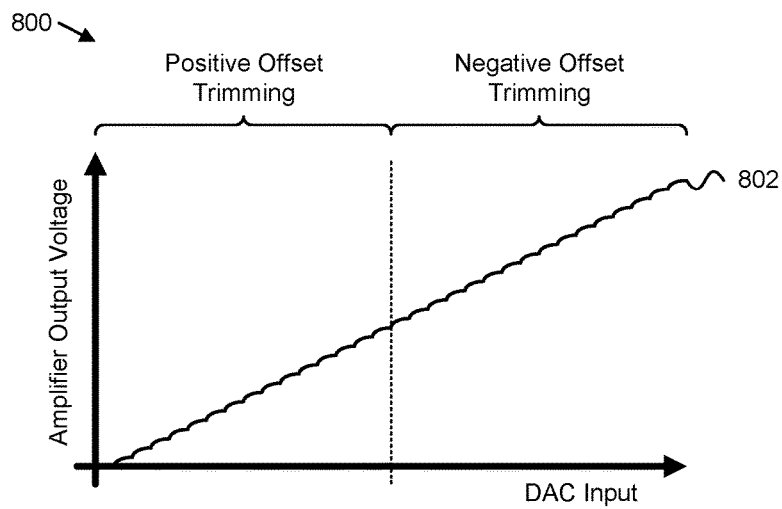
FIG. 8 is a graph illustrating one embodiment of an amplifier output voltage with offset trimming.

FIG. 8 is a graph 800 illustrating one embodiment of an amplifier output voltage with offset trimming. In the depicted embodiment, the current sources 704, 726 are controlled by a DAC input stage (e.g., a thermometric decoder). Output voltage trimming is done in a low voltage to high voltage direction as described above, so that the output voltage 802 increases in predetermined steps from maximum positive output trimming (lowest output voltage) to maximum negative output trimming (highest output voltage) as the DAC input increases.

In the depicted embodiment, at an intermediate DAC input (indicated by the dashed line), the currents from current sources 704, 726 are both zero, and the output voltage is untrimmed. At higher DAC inputs, the current $I_{NOS}$ from the first variable current source 704 is increased to increase the voltage at the non-inverting input 708 and the output 716, for trimming negative voltage offsets. At lower DAC inputs, the current $I_{POS}$ from the second variable current source 726 is increased to decrease the output voltage, for trimming positive voltage offsets. In certain embodiments, resistances (e.g., $R_{LOAD}$ and $R_{TOP}$) may be configured so that the output step size for positive output trimming equals the output step size for negative output trimming.

Figure 9:
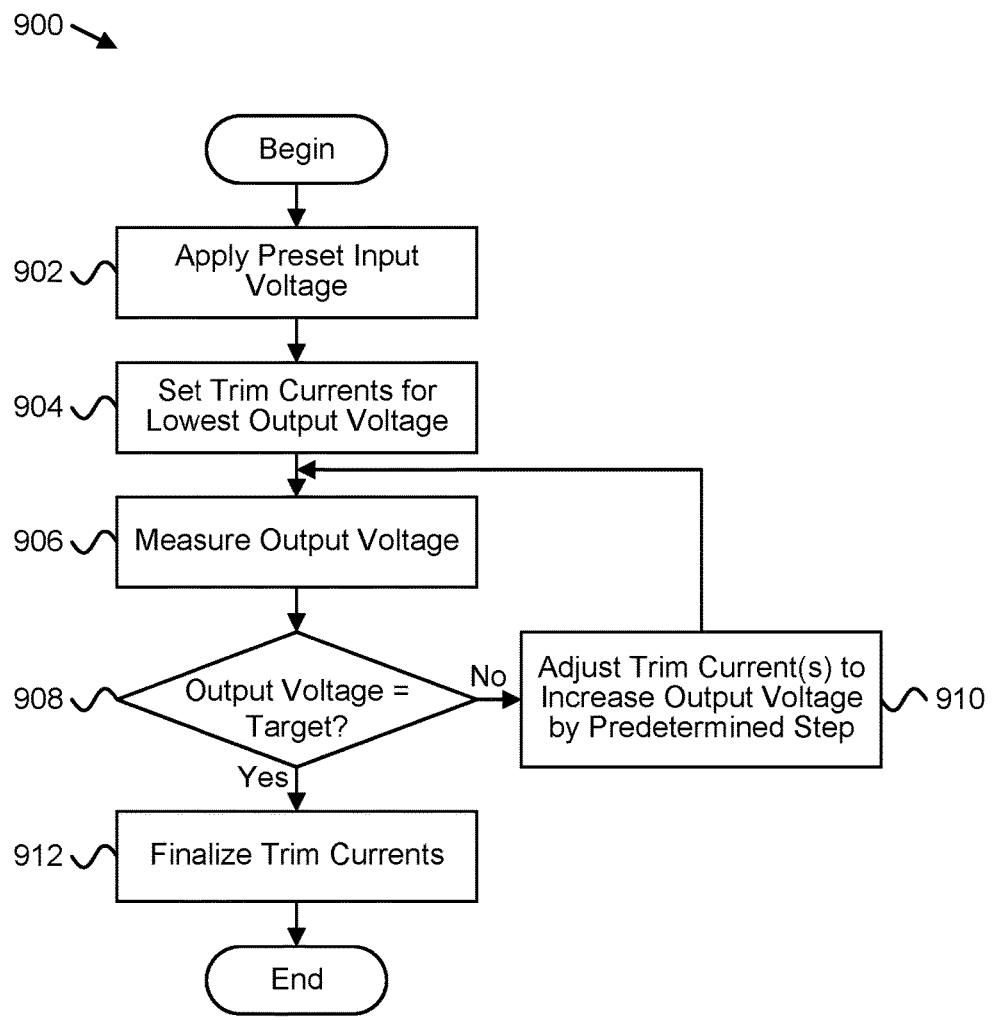
FIG. 9 is a schematic flow chart diagram illustrating one embodiment of a method for amplifier offset trimming.

FIG. 9 is a schematic flow chart diagram illustrating one embodiment of a method 900 for amplifier offset trimming. In a certain embodiment, the method 900 may be performed by a manufacturer of an integrated circuit die comprising an amplifier 712, at a die sort time. The method 900 begins, and a preset input voltage, corresponding to a target output voltage, is applied 902 to the non-inverting input 708 of an amplifier 712. Trim currents $I_{NOS}$ and $I_{POS}$ are set 904 for a lowest trimmed output voltage (e.g., maximum $I_{POS}$ and minimum $I_{NOS}$). The output voltage is measured 906, and compared 908 to the target voltage. If the output voltage equals the target voltage (to within a tolerance level, such as half of a step size for adjusting the output voltage), then the trim currents $I_{NOS}$ and $I_{POS}$ are finalized 912, and the method 900 ends. If the output voltage does not equal the target voltage (to within the tolerance level), then the trim currents $I_{NOS}$ and $I_{POS}$ are adjusted 910 (e.g., by decreasing $I_{POS}$ or increasing $I_{NOS}$) to increase the output voltage by a predetermined step. The increased output voltage is then measured 906, and compared 908 to the target voltage, and the method 900 continues.

In various embodiments, a means for amplification of an input voltage to drive a word line voltage for a non-volatile memory array may include an amplifier 712, an amplification component 406, a word line driver 150, a die controller 220 in communication with the word line driver 150, peripheral or management circuits for a non-volatile memory element 123, other logic hardware, and/or other executable code stored on a computer readable storage medium. Other embodiments may include similar or equivalent means for amplification of an input voltage.

In various embodiments, a means for providing a first current, such that increasing the first current increases the word line voltage, may include a first variable current source 704, a current-based DAC, a negative trim control 702, other logic hardware, and/or other executable code stored on a computer readable storage medium. Other embodiments may include similar or equivalent means for providing a first current.

In various embodiments, a means for providing a second current, such that increasing the second current decreases the word line voltage, may include a second variable current source 726, a current-based DAC, a positive trim control 724, other logic hardware, and/or other executable code stored on a computer readable storage medium. Other embodiments may include similar or equivalent means for providing a second current.

In various embodiments, a means for providing an input voltage for an amplifier 712 may include a variable voltage source 402, a signal generator, a line coupling a variable voltage source 402 to the amplifier, a controller that controls the voltage of a variable voltage source 402, other logic hardware, and/or other executable code stored on a computer readable storage medium. Other embodiments may include similar or equivalent means for providing an input voltage.

In various embodiments, a means for controlling the first current and the second current for an amplifier 712 may include a negative trim control 702, a positive trim control 724, a DAC input stage, a thermometric decoder, other logic hardware, and/or other executable code stored on a computer readable storage medium. Other embodiments may include similar or equivalent means for controlling currents.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:
1. An apparatus comprising:
a differential amplifier comprising a non-inverting input, an inverting input, and an output coupled to the inverting input via a voltage divider;

a first variable current source coupled to the non-inverting input, such that increasing a current from the first variable current source increases a voltage at the non-inverting input; and a second variable current source coupled to the inverting input, and to the output via the voltage divider, such that increasing a current from the second variable current source decreases a voltage at the output.

2. The apparatus of claim 1, further comprising an integrated circuit die, wherein the integrated circuit die comprises the differential amplifier, the first variable current source, and the second variable current source.

3. The apparatus of claim 2, wherein the current from the first variable current source and the current from the second variable current source are set by a manufacturer of the integrated circuit die.

4. The apparatus of claim 1, wherein the current from the first variable current source is set at a nonzero value and the current from the second variable current source is set at zero.

5. The apparatus of claim 1, wherein the current from the first variable current source is set at zero and the current from the second variable current source is set at a nonzero value.

6. The apparatus of claim 1, wherein one or more of the first variable current source and the second variable current source comprises a current-based digital-to-analog converter ("DAC").

7. The apparatus of claim 1, wherein the current from the first variable current source and the current from the second variable current source are set to produce a target output voltage at the output of the differential amplifier in response to a preset input voltage.

8. The apparatus of claim 7, wherein the differential amplifier is a complementary metal-oxide-semiconductor ("CMOS") amplifier with a minimum output voltage of zero volts, and wherein the target output voltage is between zero and one hundred millivolts.

9. The apparatus of claim 1, wherein the current from the first variable current source and the current from the second variable current source are controlled by a thermometric decoder.

10. The apparatus of claim 1, wherein an output voltage change from increasing the current from the first variable current source by a first predetermined increment is equal to an output voltage change from decreasing the current from the second variable current source by a second predetermined increment.

11. The apparatus of claim 1, wherein an output voltage change from changing one or more of the current from the first variable current source and the current from the second variable current source is based on a ratio of temperature dependent resistances, such that the output voltage change is temperature independent.

12. The apparatus of claim 1, wherein the first variable current source is further coupled to ground via a load resistance, such that the current from the first variable current source affects the voltage at the non-inverting input in proportion to the load resistance, the load resistance comprising an output impedance of a voltage source that provides an input voltage for the differential amplifier.

13. The apparatus of claim 1, wherein the second variable current source is further coupled to ground via a bottom resistance of the voltage divider, and to the output via a top resistance of the voltage divider, such that the current from the second variable current source affects the voltage at the output in proportion to the top resistance of the voltage divider.

14. The apparatus of claim 1, further comprising a variable voltage source and a word line of a non-volatile memory array, wherein the variable voltage source provides a ramping voltage signal that is amplified by the differential amplifier and applied to the word line.

15. A system comprising:
one or more memory die, the memory die comprising:
an array of non-volatile memory cells coupled to a plurality of word lines;
a plurality of differential amplifiers coupled to the word lines to produce word line voltages, the differential amplifiers comprising non-inverting inputs, inverting inputs, and outputs coupled to the inverting inputs via voltage dividers;
a plurality of first variable current sources coupled to the non-inverting inputs of the differential amplifiers, such that increasing a current from one of the first variable current sources increases a voltage at a corresponding non-inverting input; and
a plurality of second variable current sources coupled to the inverting inputs of the differential amplifiers, and to the outputs via the voltage dividers, such that increasing a current from one of the second variable current sources decreases a voltage at a corresponding output.

16. The system of claim 15, further comprising a plurality of variable voltage sources that provide ramping voltage signals for amplification by the differential amplifiers.

17. The system of claim 15, wherein currents for the first variable current sources and the second variable current sources are set by a manufacturer of the memory die to trim output voltages of the differential amplifiers.

18. An apparatus comprising:
means for amplification of an input voltage to drive a word line voltage for a non-volatile memory array;
means for providing a first current, the means for providing the first current coupled to a non-inverting input of the means for amplification, and coupled to ground via a load resistance, such that increasing the first current increases the word line voltage; and
means for providing a second current, the means for providing the second current coupled to an inverting input of the means for amplification, coupled to an output of the means for amplification via a top resistor of a voltage divider, and coupled to ground via a bottom resistor of the voltage divider, such that increasing the second current decreases the word line voltage.

19. The apparatus of claim 18, further comprising means for producing the input voltage.

20. The apparatus of claim 18, further comprising means for controlling the first current and the second current to produce a target word line voltage in response to a preset input voltage.

* * * * *